(12) United States Patent
Wu et al.

(10) Patent No.: US 11,199,749 B2
(45) Date of Patent: Dec. 14, 2021

(54) DISPLAY DEVICE

(71) Applicants: Beijing BOE Optoelectronics Technology Co., Ltd., Beijing (CN); BOE Technology Group Co., Ltd., Beijing (CN)

(72) Inventors: Hao Wu, Beijing (CN); Xiaoping Zhang, Beijing (CN); Hui Yin, Beijing (CN); Qi Jing, Beijing (CN); Zheng Zhang, Beijing (CN); Gang CI, Beijing (CN); Xiao Ma, Beijing (CN); Zhenhua Luo, Beijing (CN); Luo Zhang, Beijing (CN); Xuewen Cao, Beijing (CN); Binbin Liu, Beijing (CN); Wei Su, Beijing (CN); Hyungkyu Kim, Beijing (CN); Site Cai, Beijing (CN)

(73) Assignees: Beijing BOE Optoelectronics Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 366 days.

(21) Appl. No.: 16/473,080

(22) PCT Filed: Nov. 13, 2018

(86) PCT No.: PCT/CN2018/115265
§ 371 (c)(1),
(2) Date: Jun. 24, 2019

(87) PCT Pub. No.: WO2019/205587
PCT Pub. Date: Oct. 31, 2019

(65) Prior Publication Data
US 2021/0333632 A1 Oct. 28, 2021

(30) Foreign Application Priority Data
Apr. 25, 2018 (CN) .......................... 201810378434.3

(51) Int. Cl.
*H05K 1/18* (2006.01)
*H05K 9/00* (2006.01)
(Continued)

(52) U.S. Cl.
CPC .. *G02F 1/136204* (2013.01); *G02F 1/133334* (2021.01); *G02F 1/133603* (2013.01);
(Continued)

(58) Field of Classification Search
CPC ......... G02F 1/133603; G02F 1/133334; G02F 1/133612; G02F 1/133615;
(Continued)

(56) References Cited

U.S. PATENT DOCUMENTS

2009/0067112 A1 3/2009 Takabayashi
2010/0265430 A1 10/2010 Xu
(Continued)

FOREIGN PATENT DOCUMENTS

| CN | 101866069 A | 10/2010 |
|---|---|---|
| CN | 102620195 A | 8/2012 |

(Continued)

OTHER PUBLICATIONS

International Search Report issued in related PCT Application No. PCT/CN2018/115265.
(Continued)

*Primary Examiner* — Joseph L Williams
*Assistant Examiner* — Jose M Diaz
(74) *Attorney, Agent, or Firm* — Arent Fox LLP; Michael Fainberg

(57) ABSTRACT

This disclosure discloses a display device including: a display panel; a backlight module including a light-emitting diode group; the display panel including a first substrate and a second substrate successively along the direction from the backlight module, wherein the first substrate includes an
(Continued)

exposed area which is not covered by the second substrate, and an orthographic projection of the light-emitting diode group on the first substrate lies in the exposed area; a protective cover plate on the light exit side of the display panel; a housing on the side of the backlight module away from the display panel, and is grounded; and a conductive structure, wherein an orthographic projection of the conductive structure on the first substrate at least partially overlaps with the orthographic projection of the light-emitting diode group on the first substrate, and the conductive structure connects the protective cover plate with the housing.

13 Claims, 2 Drawing Sheets

(51) Int. Cl.
    *G02F 1/1362*      (2006.01)
    *G02F 1/13357*    (2006.01)
    *G02F 1/1333*      (2006.01)
    *G02F 1/1335*      (2006.01)

(52) U.S. Cl.
    CPC ....... *G02F 1/133612* (2021.01); *H05K 1/189* (2013.01); *H05K 9/0067* (2013.01); *H05K 9/0079* (2013.01); *H05K 2201/10136* (2013.01)

(58) Field of Classification Search
    CPC ........... G02F 1/133311; G02F 1/36204; G02F 1/136204; H05K 1/189; H05K 2201/10136; H05K 9/0067; H05K 9/0079; G02B 6/0001
    See application file for complete search history.

(56) References Cited

U.S. PATENT DOCUMENTS

2014/0133174 A1\*    5/2014    Franklin .............. H05K 9/0067
                                                                          362/606
2015/0002785 A1     1/2015    Huang et al.

FOREIGN PATENT DOCUMENTS

| | | |
|---|---|---|
| CN | 106773295 A | 5/2017 |
| CN | 106980209 A | 7/2017 |
| CN | 108535903 A | 9/2018 |
| KR | 20130050564 A * | 5/2013 |
| KR | 10-2018-0079044 A | 7/2018 |

OTHER PUBLICATIONS

Office Action corresponding to Chinese Application No. 201810378434.3 dated Mar. 18, 2020.

\* cited by examiner

DISPLAY DEVICE

This application is a US National Stage of International Application No. PCT/CN2018/115265, filed Nov. 13, 2018, which claims priority to Chinese Patent Application No. 201810378434.3, filed with the Chinese Patent Office on Apr. 25, 2018, and entitled "Display module and Display device", which is hereby incorporated by reference in its entirety.

FIELD

This disclosure relates to the field of display technologies, and particularly to a display device.

BACKGROUND

As an all-screen display panel is being applied to a mobile phone and other mobile terminals, it is increasingly common to design a first substrate and a color filter substrate of the display panel at their end portions to be special shape, thus resulting in a shorter distance of light-emitting diodes from the edge of the screen, and when electrostatic charges are produced in an area around a display module, and conducted to an area where the light-emitting diodes are located, so that the light-emitting diodes may go out, be burned, or otherwise damaged due to the electrostatic charges.

SUMMARY

An embodiment of this disclosure provides a display device. The display device includes: a display panel; a backlight module including a light-emitting diode group; the display panel including a first substrate and a second substrate successively arranged along the direction away from the backlight module, wherein the first substrate includes an exposed area which is not covered by the second substrate, and an orthographic projection of the light-emitting diode group on the first substrate lies in the exposed area; a protective cover plate on the light exit side of the display panel; a housing on the side of the backlight module away from the display panel, the housing being grounded; and a conductive structure, wherein an orthographic projection of the conductive structure on the first substrate at least partially overlaps with the orthographic projection of the light-emitting diode group on the first substrate, and the conductive structure connects the protective cover plate with the housing.

Optionally in the embodiment of this disclosure, the display device further includes a flexible printed circuit connected with the first substrate; and the flexible printed circuit includes a first ground terminal, and the conductive structure is electrically connected with the first ground terminal.

Optionally in the embodiment of this disclosure, the conductive structure includes a conductivity shielding layer on the side of the first substrate proximate to the second substrate; the conductivity shielding layer is in the exposed area of the first substrate, and an orthographic projection of the conductivity shielding layer on the first substrate covers an orthographic projection of at least one light-emitting diode in the light-emitting diode group on the first substrate; the first substrate is provided with a contact pad in the exposed area A; and the conductivity shielding layer is electrically connected with the contact pad, and the first ground terminal is electrically connected with the contact pad.

Optionally in the embodiment of this disclosure, the orthographic projection of the conductivity shielding layer on the first substrate covers orthographic projections of light-emitting diodes at two ends of the light-emitting diode group on the first substrate.

Optionally in the embodiment of this disclosure, a material of the conductivity shielding layer includes a transparent conductive material.

Optionally in the embodiment of this disclosure, the conductive structure includes a conductive buffer section and a conductive connection section; the conductive buffer section includes one end connected with a side of the protective cover plate facing the first substrate, and the other end connected with the first substrate in the exposed area; the conductive connection section is bonded to sides of the first substrate and the backlight module corresponding to the light-emitting diode group, and the conductive connection section is lapped with the conductive buffer section; an orthographic projection of the conductive buffer section on the first substrate does not overlap with an orthographic projection of the flexible printed circuit on the first substrate; and the conductive connection section has no lapped area with the flexible printed circuit.

Optionally in the embodiment of this disclosure, the protective cover plate is provided with a second ground terminal on the side thereof proximate to the display panel, the second ground terminal being grounded; and the conductive buffer section is electrically connected with the second ground terminal.

Optionally in the embodiment of this disclosure, the conductive structure further includes a conductive layer on the side of the backlight module proximate to the housing; and the conductive layer is lapped with the conductive connection section, and is electrically connected with the housing.

Optionally in the embodiment of this disclosure, an orthographic projection of the conductive layer on the first substrate covers at least the orthographic projection of the light-emitting diode group on the first substrate.

Optionally in the embodiment of this disclosure, a material of the conductive layer includes graphite.

Optionally in the embodiment of this disclosure, a material of the conductive buffer section includes conductive foam.

Optionally in the embodiment of this disclosure, the conductive connection section is a conductive adhesive coating layer.

Optionally in the embodiment of this disclosure, the backlight module further includes: a metal backboard on the side of the light-emitting diode group away from the display panel, and a reflecting sheet between the light-emitting diode group and the metal backboard; and the metal backboard is electrically connected with the conductive structure.

DETAILED DESCRIPTION

In order to alleviate the light-emitting diodes in the backlight module, and thus the display device, from being damaged due to the electrostatic charges, so as to prolong the service lifetime of the display device, an embodiment of this disclosure provides a display device. In order to make the objects, technical solutions, and advantages of this disclosure more apparent, embodiments of this disclosure will be described below in further details.

Figure 1:
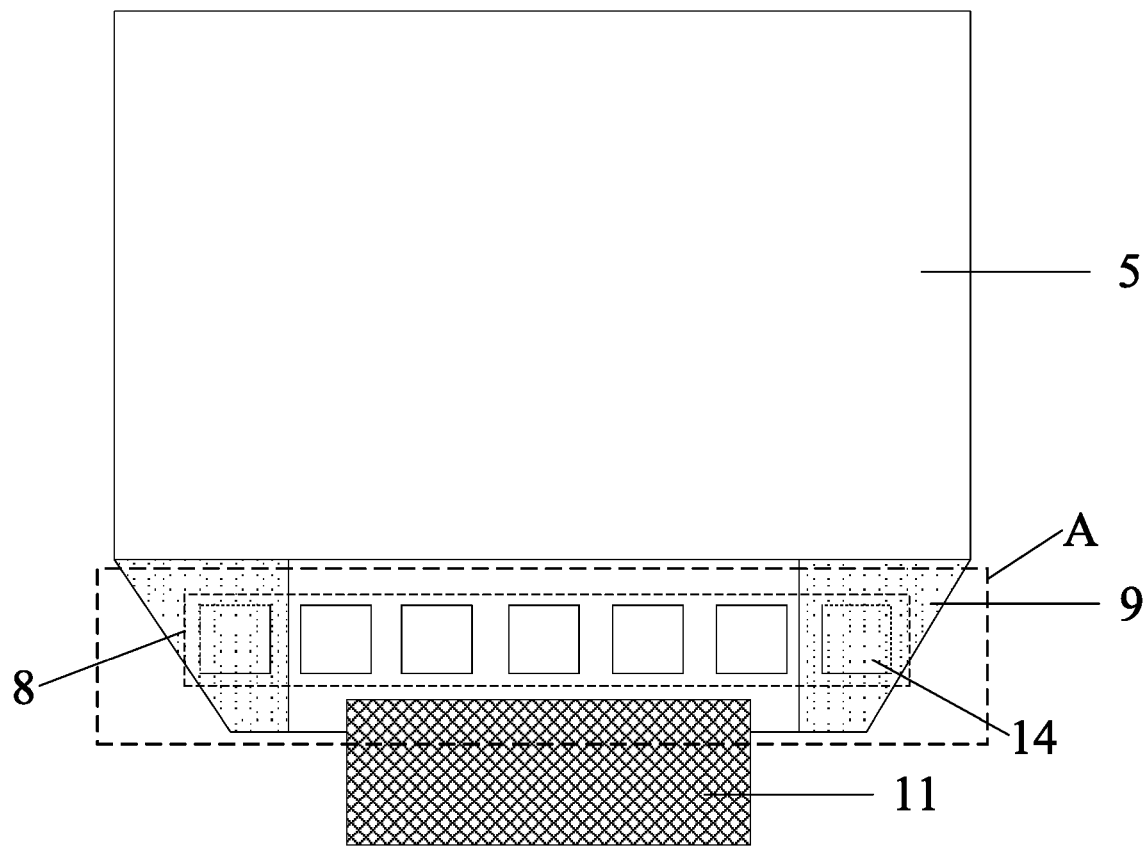
FIG. 1 is a first schematic structural diagram of a display device according to an embodiment of this disclosure.
Figure 2:
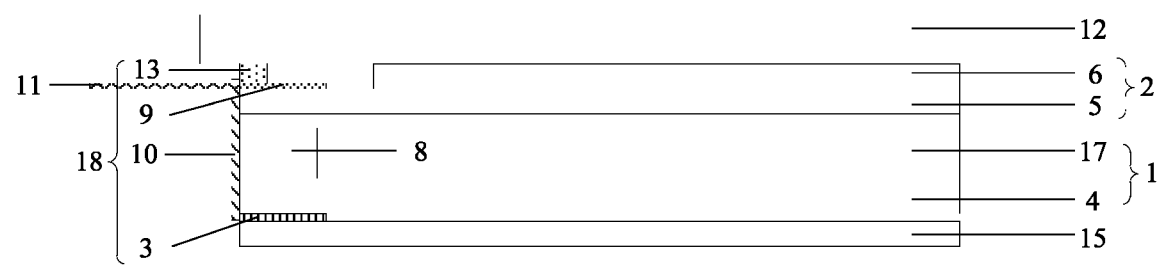
FIG. 2 is a second schematic structural diagram of the display device according to the embodiment of this disclosure.
Figure 3:
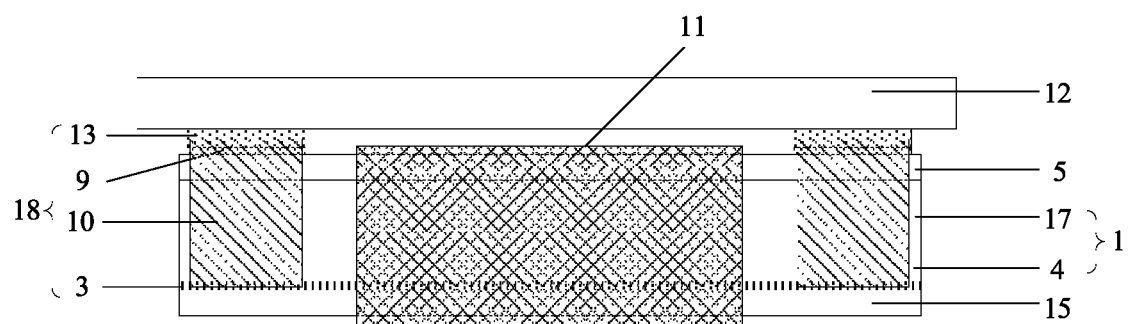
FIG. 3 is a third schematic structural diagram of the display device according to the embodiment of this disclosure.
Figure 4:
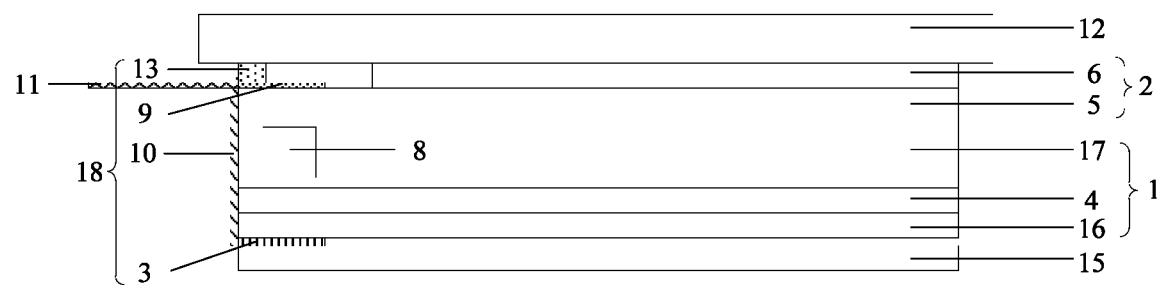
FIG. 4 is a fourth schematic structural diagram of the display device according to the embodiment of this disclosure.

FIG. 1 is a schematic structural diagram of a display device according to an embodiment of this disclosure in a top view, FIG. 2 and FIG. 4 are schematic structural diagrams of the display device above according to the embodiment of this disclosure in sectional views, and FIG. 3 is a schematic structural diagram of the display device above according to the embodiment of this disclosure in a side view.

As illustrated in FIG. 1 and FIG. 2, a display device according to an embodiment of this disclosure includes: a display panel 2; a backlight module 1 including a light-emitting diode group 8; the display panel 2 including a first substrate 5 and a second substrate 6 arranged successively in the direction away from the backlight module 1, where the first substrate 5 includes an exposed area which is not covered by the second substrate 6 (as denoted in the dotted box A as illustrated), and an orthographic projection of the light-emitting diode group 8 on the first substrate 5 lies in the exposed area A; a protective cover plate 12 located on the light exit side of the display panel 2; a housing 15 located on the side of the backlight module 1 away from the display panel, and arranged grounded; and a conductive structure 18, where an orthographic projection of the conductive structure 18 on the first substrate 5 at least partially overlaps with the orthographic projection of the light-emitting diode group 8 on the first substrate 5, and the conductive structure 18 connects the protective cover plate 12 with the housing 15.

In the display device above according to the embodiment of this disclosure, the housing is arranged grounded, the conductive structure is arranged to connect the protective cover plate with the housing, the orthographic projection of the conductive structure on the first substrate at least partially overlaps with the orthographic projection of the light-emitting diode group on the first substrate, and when there are electrostatic charges conducted from a corner in the display device where the light-emitting diode group is located, the conductive structure can release the electrostatic charges through the housing to thereby prevent the electrostatic charges from affecting the light-emitting diode group, and alleviate light-emitting diodes from being damaged and thus the display device from being damaged due to the electrostatic charges, so as to prolong the service lifetime of the display device.

As illustrated in FIG. 2, while a user is operating on the display device, his or her finger or another object touches the surface of the display screen or the display device, and there is a friction between them, so electrostatic charges tend to be produced on the side of the protective cover plate 12; and moreover the housing 15 is generally a conductor arranged as a whole and arranged grounded, so the housing 15 is capable of releasing the electrostatic charges, and the conductive structure 18 can be arranged to connect the housing 15 with the protective cover plate 12, thus resulting in a protective system protecting against electrostatic charges, so that when electrostatic charges are generated on the surface of the protective cover plate 12, or a side of the display device, the electrostatic charges can be conducted to the housing 15 through the conductive structure 18, and released to thereby protect the light-emitting diode group 8.

Moreover since the orthographic projection of the conductive structure 18 on the first substrate 5 at least partially overlaps with the orthographic projection of the light-emitting diode group 8 on the first substrate 5, the conductive structure 18 can shield at least a part of the light-emitting diode group 8 in the direction perpendicular to the surface of the display panel, to thereby alleviate the light-emitting diode group 8 from being damaged due to the electrostatic charges in the direction perpendicular to the surface of the display panel.

In the embodiment of this disclosure, the display panel 2 can be a liquid crystal display panel, and the light-emitting diode group 8 in the backlight module 1 can be located on one side of the backlight module 1, or can be located on two or more sides of the backlight module 1, although the embodiment of this disclosure will not be limited thereto; and the light-emitting diode group 8 can include a plurality of light-emitting diodes 14, which can be generally arranged in one or more rows, where the number and the arrangement pattern of light-emitting diodes 14 will not be limited to any specific number and arrangement pattern.

Specifically in the display device above according to the embodiment of this disclosure, also as illustrated in FIG. 1 and FIG. 2, the display device further includes a flexible printed circuit 11 connected with the first substrate 5.

The flexible printed circuit 11 includes a first ground terminal (not illustrated), the conductive structure 18 is electrically connected with the first ground terminal.

The conductive structure 18 can be electrically connected with the first ground terminal on the flexible printed circuit 11 to thereby conduct the electrostatic charges to the ground through first ground terminal to be released, thus resulting in an additional electrostatic charge releasing path; and when electrostatic charges are generated in a peripheral area of the display device, the electrostatic charges can be conducted to the first ground terminal of the flexible printed circuit 11 through the conductive structure 18 to be released, or can be conducted to the housing 15 to be released, to thereby improve the capacity and the speed of releasing the electrostatic charges so as to further alleviate the light-emitting diode group 18 from being damaged due to the electrostatic charges, thus improving effectively the efficiency of releasing the electrostatic charges, and the service lifetime of the display device.

Specifically in the display device above according to the embodiment of this disclosure, the conductive structure 18 includes a conductivity shielding layer 9 located on the side of the first substrate 5 proximate to the second substrate 6.

The conductivity shielding layer 9 is located in the exposed area A of the first substrate 5, and an orthographic projection of the conductivity shielding layer 9 on the first substrate 5 covers an orthographic projection of at least one light-emitting diode 14 in the light-emitting diode group 18 on the first substrate 5.

The first substrate 5 is provided with a contact pad (not illustrated) in the exposed area A; and the conductivity shielding layer 9 is electrically connected with the contact pad, and the first ground terminal is electrically connected with the contact pad.

In a real application, the first ground terminal on the flexible printed circuit 11 can be connected with the contact pad in the exposed area A, and both the contact pad and the conductivity shielding layer 9 can be located in the exposed area A of the first substrate 5, so the contact pad can be connected with the conductivity shielding layer 9 through a wire or another conductor so that the conductivity shielding layer 9 is electrically connected with the first ground terminal. Moreover the orthographic projection of the conductivity shielding layer 9 on the first substrate 5 can cover the orthographic projection of at least one light-emitting diode 14 in the light-emitting diode group 18 on the first substrate 5, to thereby shield the light-emitting diode from being damaged due to the electrostatic charges generated on the side of the first substrate 5 proximate to the protective cover plate 12, so as to protect the light-emitting diode 14 from the electrostatic charges, but also narrow an area where the conductivity shielding layer 9 is coated, thus lowering the production cost of the display module.

In a specific implementation, a driver chip or another wiring can be arranged in the exposed area A of the first substrate 5, and in order to avoid the conductivity shielding layer 9 from being short-circuited with the driver chip or another wiring, in the display device above according to the embodiment of this disclosure, the orthographic projection of the conductivity shielding layer 9 on the first substrate 5 covers orthographic projections of light-emitting diodes 14 on two ends in the light-emitting diode group 18 on the first substrate 5 to thereby prevent the electrostatic charges from being transmitted from the two ends of the light light-emitting diode group 18 to the light-emitting diodes, and thus damaging the light-emitting diodes; and moreover another wiring in the exposed area A can also protect the light-emitting diodes in the light-emitting diode group 18 against the electrostatic charges, so the conductivity shielding layer 9 can be arranged in such a way that the orthographic projection thereof on the first substrate 5 shields the light-emitting diodes at the two ends to thereby well protect them against the electrostatic charges.

Specifically in the display device above according to the embodiment of this disclosure, the material of the conductivity shielding layer 9 can include a transparent conductive material, e.g., Indium Tin Oxide (ITO) or another transparent conductive oxide material, so that the electrostatic charges can be released without affecting the display effect of the display module.

Specifically in the display device above according to the embodiment of this disclosure, as illustrated in FIG. 2 and FIG. 3, the conductive structure 18 includes a conductive buffer section 13 and a conductive connection section 10.

The conductive buffer section 13 includes one end connected with the side of the protective cover plate 12 facing the first substrate 5, and the other end connected with the first substrate 5 in the exposed area.

The conductive connection section 10 is bonded to the sides of the first substrate 5 and the backlight module 1 corresponding to the light-emitting diode group 18, and the conductive connection section 10 is lapped with the conductive buffer section 13.

The orthographic projection of the conductive buffer section 13 on the first substrate 5 does not overlap with the orthographic projection of the flexible printed circuit 11 on the first substrate 5.

The conductive connection section 10 has no lapped area with the flexible printed circuit 11.

The conductive buffer section 13 is filled between the exposed area of the first substrate 5 and the protective cover plate, and the orthographic projection of the conductive buffer section 13 on the first substrate 5 does not overlap with the orthographic projection of the flexible printed circuit 11 on the first substrate 5, so that the conductive buffer section 13 is kept away from the flexible printed circuit board 11, to prevent from short-circuit so as not to affect the function of the flexible printed board 11. Moreover the conductive buffer section 13 can be connected with the first substrate 5 through the conductivity shielding layer 9 so that the conductive buffer section 13 is electrically connected with the first ground terminal of the flexible printed circuit 11.

Moreover the conductive connection section 10 is bonded to the sides of the first substrate 5 and the backlight module 1 so that one end of the conductive connection section 10 can be lapped with the conductive buffer section 13, and the other end thereof can be lapped directly or indirectly with the housing 15, so the conductive buffer section 13 is electrically connected with the housing 15; and the conductive connection section 10 has no lapped area with the flexible printed circuit 11 so as not to hinder the flexible printed circuit from being bent toward the backside of the housing 15.

Furthermore in the display device above according to the embodiment of this disclosure, as illustrated in FIG. 2 and FIG. 3, the protective cover plate 12 is provided with a second ground terminal (not illustrated) on the side thereof proximate to the display panel 2, the second ground terminal is arranged grounded; and the conductive buffer section 13 is electrically connected with the second ground terminal.

In a specific implementation, in order to electrically connect the conductive buffer section 13 with the second ground terminal, the second ground terminal can be arranged at the position of the protective cover plate facing the conductive buffer section 13 so that the second ground terminal can directly contact and be connected with the conductive buffer section 13. The conductive buffer section 13 is connected with the second ground terminal, thus resulting in an additional electrostatic charge releasing path through the conductive structure 18. For example, when electrostatic charges are generated on the backlight module side of the display device, a part of the electrostatic charges can be released at the housing 15, and the other electrostatic charges can be conducted to the first ground terminal on the flexible printed circuit 11 and released, or can be conducted to the second ground terminal on the protective cover plate 12 and released; or when electrostatic charges are generated on the protective cover plate 12 side of the display device, a part of the electrostatic charges can be conducted to the second ground terminal on the protective cover plate 12 and released, and the other electrostatic charges can be conducted to the first ground terminal on the flexible printed circuit 11 and released, or can be conducted to the housing and released, thus improving the capacity of the conductive structure to release the electrostatic charges, so as to conduct the electrostatic charges away rapidly, thus preventing the electrostatic charges from affecting the light-emitting diode group 8 or another structure.

Specifically in the display device above according to the embodiment of this disclosure, as illustrated in FIG. 2 and FIG. 3, the conductive structure 18 can further include a conductive layer 3 located on the side of the backlight module 1 proximate to the housing 15.

The conductive layer 3 is lapped with the conductive connection section 10, and is electrically connected with the housing 15.

The conductive layer 3 is arranged between the backlight module 1 and the housing 15, and the conductive layer 3 is lapped with the conductive connection section 10, thus improving the conductivity compared with the conductive connection section 10 connected directly with the housing 15, so as to smoothly conduct the electrostatic charges away through the housing 15.

In this way, an electrical conductivity path through the conductive layer 3, the conductive connection section 10, and the conductivity shielding layer 9 can be formed. When there are electrostatic charges conducted from the housing 15 of the display device, the electrostatic charges are firstly transported to the conductive connection section 10 through the conductive layer 3, and then transported to the conductivity shielding layer 9 on the first substrate 5 through the conductive connection section 10, and since the conductivity shielding layer 9 is arranged grounded, the electrostatic charges can be transported to the ground through the conductivity shielding layer 9 to thereby be released there.

Moreover in order to further protect the light-emitting diode group 8, the orthographic projection of the conductive layer 3 on the first substrate 5 covers at least the orthographic projection of the light-emitting diode group 8 on the first substrate 5, that is, the conductive layer 3 can be arranged only in a strip area at the corresponding position of the light-emitting diode group 8, to shield the electrostatic charges on the side of the backlight module 1 proximate to the housing 15 from damaging the light-emitting diode group 8, and narrow the arrangement area of the conductive layer 3 while guaranteeing the electrical conductivity thereof so as to lower the production cost of the display module.

Specifically the material of the conductive layer 3 can include graphite, or can be a graphite bonding layer or a graphite coating layer, that is, the conductive layer 3 can be coated or bonded on the side of the backlight module 1 proximate to the housing 15.

In a specific implementation, in the display device above according to the embodiment of this disclosure, the material of the conductive buffer section includes conductive foam, and the conductive buffer section formed of the conductive foam can be well filled between the first substrate 5 and the protective cover plate 12 to thereby guarantee good contact between the first ground terminal on the protective cover plate, and the conductive structure.

Specifically in the display device above according to the embodiment of this disclosure, the conductive connection section 10 is a conductive adhesive coating layer, and in a fabrication process, the conductive adhesive coating layer can be bonded directly to the sides of the display panel 2 and the backlight module 1 conveniently. The conductive connection section can be a conductive adhesive coating layer which is planar, or can be a conductive adhesive coating layer which is linear. When the conductive adhesive coating layer is planar, the efficiency of conducting the electrostatic charges can be improved in effect, and when electrostatic charges are generated in the peripheral area of the display module, and a small amount of electrostatic charges are conducted to the area where the light-emitting diodes are located, the conductive adhesive coating layer can be arranged in a multi-line pattern to thereby save the product cost.

In a real application, in the display device above according to the embodiment of this disclosure, the backlight module 1 can further include: a metal backboard 16 located on the side of the light-emitting diode group 8 away from the display panel 2, and a reflecting sheet 4 located between the light-emitting diode group 8 and the metal backboard 16.

The metal backboard 16 is electrically connected with the conductive structure 18.

Moreover the backlight module 1 generally can further include a light-guiding plate 17, the light-emitting diode group can be arranged on a side of the light-guiding plate 17, and the reflecting sheet 4 can be arranged between the light-guiding plate 17 and the metal backboard 16 to reflect light from the side of the light-guiding plate 17 proximate to the metal backboard 16 back to the light-guiding plate 17, to thereby improve the utilization ratio of the light. The metal backboard 16 can be lapped directly with the conductive layer 3 to thereby be electrically connected with the conductive structure 18 so as to prolong the path for transmitting the electrostatic charges, and to prevent the light-emitting diode group from being damaged by the electrostatic charges.

Moreover since the metal backboard 16 can be electrically conductive, the conductive connection section 10 can be connected with the housing 15 by the metal backboard 16, so the conductive layer 3 can be omitted, and the electrostatic charges can be conducted on the surface of the metal backboard 16 bonded with the reflecting sheet 4. In this way, an electrical conductivity path through the metal backboard 16, the conductive connection section 10, and the conductivity shielding layer 9 can be formed. When there are electrostatic charges conducted from below the display module, the electrostatic charges are firstly transported to the conductive connection section 10 through the conductive layer 3, and then transported to the conductivity shielding layer 9 on the first substrate 5 through the conductive connection section 10, and since the conductivity shielding layer 9 is arranged grounded, the electrostatic charges can be transported to the ground through the conductivity shielding layer 9 to thereby be released there.

In the display device above according to the embodiment of this disclosure, the housing is arranged grounded, the conductive structure is arranged to connect the protective cover plate with the housing, and the conductive structure is arranged to be connected with the first ground terminal on the flexible printed circuit, and the second ground terminal on the protective cover plate, thus resulting in an electrostatic charge releasing path; and when electrostatic charges are generated at some position, the electrostatic charges can be conducted to a plurality of positions to be released, to thereby improve the capacity of releasing the electrostatic charges, so as to prevent the electrostatic charges from affecting the light-emitting diode group, and to alleviate the light-emitting diodes from being damaged and thus alleviate the display device from being damaged due to the electrostatic charges, thus prolonging the service lifetime of the display device.

Although the preferred embodiments of the invention have been described, those skilled in the art benefiting from the basic inventive concept can make additional modifications and variations to these embodiments. Therefore the appended claims are intended to be construed as encompassing the preferred embodiments and all the modifications and variations coming into the scope of the invention.

Evidently those skilled in the art can make various modifications and variations to the invention without departing from the spirit and scope of the invention. Thus the invention is also intended to encompass these modifications and variations thereto so long as the modifications and variations come into the scope of the claims appended to the invention and their equivalents.

The invention claimed is:

1. A display device, comprising:
   a display panel;
   a backlight module comprising a light-emitting diode group;
   the display panel comprising a first substrate and a second substrate successively arranged along a direction away from the backlight module, wherein the first substrate comprises an exposed area which is not covered by the second substrate, and an orthographic projection of the light-emitting diode group on the first substrate lies in the exposed area;
   a protective cover plate on a light exit side of the display panel;
   a housing on a side of the backlight module away from the display panel, the housing being grounded; and
   a conductive structure, wherein an orthographic projection of the conductive structure on the first substrate at least partially overlaps with the orthographic projection of the light-emitting diode group on the first substrate, and the conductive structure connects the protective cover plate with the housing.

2. The display device according to claim 1, further comprising a flexible printed circuit connected with the first substrate; and
   the flexible printed circuit comprises a first ground terminal, and the conductive structure is electrically connected with the first ground terminal.

3. The display device according to claim 2, wherein the conductive structure comprises a conductivity shielding layer on a side of the first substrate proximate to the second substrate;
   the conductivity shielding layer is in the exposed area of the first substrate, and an orthographic projection of the conductivity shielding layer on the first substrate covers an orthographic projection of at least one light-emitting diode in the light-emitting diode group on the first substrate;
   the first substrate is provided with a contact pad in the exposed area; and
   the conductivity shielding layer is electrically connected with the contact pad, and the first ground terminal is electrically connected with the contact pad.

4. The display device according to claim 3, wherein the orthographic projection of the conductivity shielding layer on the first substrate covers orthographic projections of light-emitting diodes at two ends of the light-emitting diode group on the first substrate.

5. The display device according to claim 3, wherein a material of the conductivity shielding layer comprises a transparent conductive material.

6. The display device according to claim 2, wherein the conductive structure comprises a conductive buffer section and a conductive connection section;
   the conductive buffer section comprises one end connected with a side of the protective cover plate facing the first substrate, and the other end connected with the first substrate in the exposed area;
   the conductive connection section is bonded to sides of the first substrate and the backlight module corresponding to the light-emitting diode group, and the conductive connection section is lapped with the conductive buffer section;
   an orthographic projection of the conductive buffer section on the first substrate does not overlap with an orthographic projection of the flexible printed circuit on the first substrate; and
   the conductive connection section has no lapped area with the flexible printed circuit.

7. The display device according to claim 6, wherein the protective cover plate is provided with a second ground terminal on a side thereof proximate to the display panel, the second ground terminal being grounded; and
   the conductive buffer section is electrically connected with the second ground terminal.

8. The display device according to claim 6, wherein the conductive structure further comprises a conductive layer on a side of the backlight module proximate to the housing; and
   the conductive layer is lapped with the conductive connection section, and is electrically connected with the housing.

9. The display device according to claim 8, wherein an orthographic projection of the conductive layer on the first substrate covers at least the orthographic projection of the light-emitting diode group on the first substrate.

10. The display device according to claim 8, wherein a material of the conductive layer comprises graphite.

11. The display device according to claim 6, wherein a material of the conductive buffer section comprises conductive foam.

12. The display device according to claim 6, wherein the conductive connection section is a conductive adhesive coating layer.

13. The display device according to claim 6, wherein the backlight module further comprises: a metal backboard on a side of the light-emitting diode group away from the display panel, and a reflecting sheet between the light-emitting diode group and the metal backboard; and
    the metal backboard is electrically connected with the conductive structure.

\* \* \* \* \*